United States Patent [19]
Roche et al.

[11] Patent Number: 5,143,277
[45] Date of Patent: Sep. 1, 1992

[54] METHOD FOR THE MOUNTING OF MINIATURE ELECTRONIC BEAM LEAD COMPONENTS

[75] Inventors: Pascal Roche, Chartres; Claude Courtin, Chatenay Malabry, both of France

[73] Assignee: Thomson-CSF, Puteaux, France

[21] Appl. No.: 825,068

[22] Filed: Jan. 24, 1992

[30] Foreign Application Priority Data

Feb. 5, 1991 [FR] France ................. 91 01270

[51] Int. Cl.$^5$ ............................. H05K 3/34
[52] U.S. Cl. .................. 228/179; 228/173.1; 29/835
[58] Field of Search .............. 228/173.1, 179, 180.2, 228/212, 15.1, 44.7; 29/835, 840, 844

[56] References Cited

U.S. PATENT DOCUMENTS

| | | | |
|---|---|---|---|
| 4,067,039 | 1/1978 | Gaiki | 228/179 |
| 4,316,320 | 2/1982 | Nogawa et al. | 228/180.2 |
| 4,729,165 | 3/1988 | Fahrenshon | 228/180.2 |
| 4,736,882 | 4/1988 | Winter et al. | 228/44.7 |
| 5,040,293 | 8/1991 | Yamizaki et al. | 228/180.2 |

FOREIGN PATENT DOCUMENTS

1001361 1/1957 Fed. Rep. of Germany .

OTHER PUBLICATIONS

Research Disclosure, "Improved Ultrasonic Bonding Wedge", No. 255, Jul. 1985.
Microwave Journal, vol. 30, No. 8, Aug. 1987, Norwood, Mass., U.S.A., pp. 119, 120, 122, 124, 126, 131, & 132, I. K. Greenshields, "Practical Bonding Techniques for Beam-Lead Diodes".
Research Disclosure, No. 300, Apr. 1989, New York, U.S.A., p. 284, "Piezoelectric Thermode for Thermo-compression Shear Bonding".
Patent Abstracts of Japan, vol. 14, No. 222 (E-926) [4165], May 10, 1990, & JP-A-54991, Feb. 23, 1990, Y. Taniguchi, "Soldering of Flexible Printed-Circuit Board".
Electronic Applications, No. 61, Aug./Sep. 1988, Paris, FR, pp. 65-73, "Cartes Imprimees Pour Montage en Surface Materiaux et Procedes Nouveaux".

*Primary Examiner*—Samuel M. Heinrich
*Attorney, Agent, or Firm*—Oblon, Spivak, McClelland, Maier & Neustadt

[57] ABSTRACT

Disclosed is a method for the mounting, on an flexible substrate, of miniature electronic components of the beam lead type. Said method consists, after a first connection lead of a component has been soldered to the substrate, in arching each of the other connection leads of the component considered during their soldering by pressing the connection lead considered on a metallized zone of the substrate by means of a tip of a soldering tool while, at the same time, making a approaching movement towards the body of the component considered with this tip before carrying out the soldering operation itself. Through this mounting method, the beam lead electronic components are no longer placed flat against the substrate with their connection leads in an extended position but are arched on these leads. This gives them a freedom of play that enables them to absorb mechanical stresses by adopting positions of greater flatness or lesser flatness on the substrate.

2 Claims, 2 Drawing Sheets

METHOD FOR THE MOUNTING OF MINIATURE ELECTRONIC BEAM LEAD COMPONENTS

BACKGROUND OF THE INVENTION

1. Field of the Invention

The invention relates to the mounting, on a flexible substrate, of miniature electronic components with solderable connection leads of the beam lead type, having straight connection leads shaped like minute beams positioned in the plane of their lower face.

2. Description of the Prior Art

Until now, it has been extremely difficult, and even impossible, to mount a beam lead component on a flexible substrate without the risk, in the shorter or longer term, of the breaking of the component or of the solderings of its connection leads because of tensile forces exerted on these leads through the flexible substrate. The first faults may appear during the mounting of the component and the subsequent faults during the operation of the equipment fitted out with such components. In the case of the faults that appear during the mounting, the breaking of the component is generally due to a depression created in the substrate during the soldering of the second connection lead or of the following ones, which causes high tensile force to be exerted on the already soldered connection lead or leads. In the other instances, the breaking is due to an exertion of tensile force on the connection leads of the component, generally prompted by the difference between, on the one hand, the heat expansion coefficients of the substrate and, on the other hand, the semiconductive material constituting the substrate. Finally, any mechanical stress exerted on the flexible support under tension is liable to prompt the same phenomenon of breakage owing to the brittleness of the beam lead components due to their very small size and the arrangement of their connection leads.

An aim of the invention is to neutralize the effects of the mechanical stresses arising from various sources, notably thermal stresses which appear on the connection leads of the beam lead components after they have been soldered to a flexible substrate.

SUMMARY OF THE INVENTION

An object of the invention is a method for the mounting, on a flexible substrate, of miniature electronic components with straight beam leads to be soldered, positioned in the plane of the lower face of the components, said method consisting, after a first connection lead of a component has been soldered to a metallized zone of the substrate, in arching each of the other connection leads of the component during their soldering by pressing the lead considered on a metallized zone of the substrate by means of a tip of a soldering tool while, at the same time, making a slight approaching movement towards the body of the component with this tip before carrying out the soldering operation itself.

The approaching motion of the tip of the soldering tool when it is being pressed on the end of a connection lead then causes this lead to get shifted towards the body of the component and results in the arching of this lead. Through this arching of their connection leads, the miniature electronic components are no longer flat against the substrate with their connection leads extended, but are arched on these leads, which gives them a freedom of play in allowing them to adopt a position of greater flatness or lesser flatness depending on the tendencies of this substrate to expand and to shrink.

BRIEF DESCRIPTION OF THE DRAWINGS

Other characteristics and advantages of the invention will emerge from the following description of a mode of implementation given by way of an example. This description shall be made with reference to the appended drawings, wherein.

In the drawings, the same references are repeated for the same elements in the different figures.

MORE DETAILED DESCRIPTION

Figure 1:
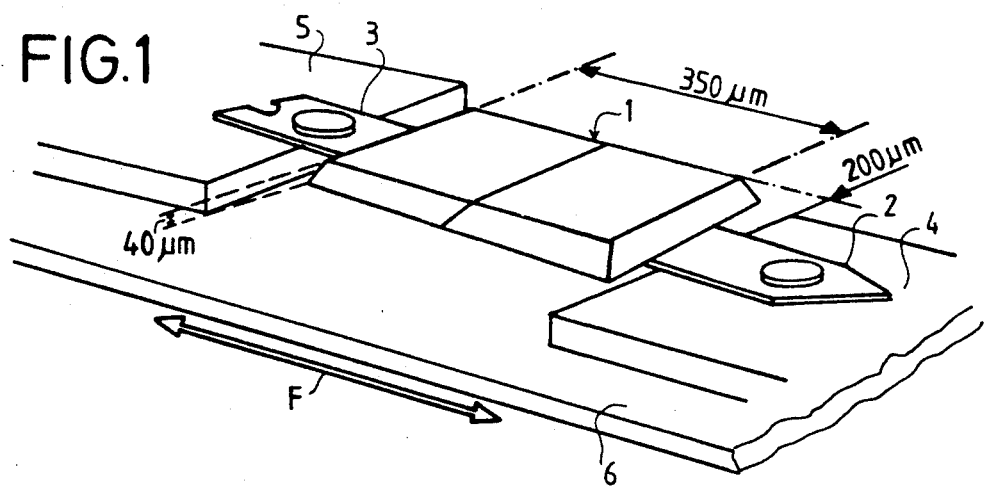
FIG. 1 shows a view, in perspective, of an electronic beam lead component mounted on a substrate according to a prior art method.

FIG. 1 shows a beam lead component 1 with two connection leads 2, 3 mounted flat, according to the method of the prior art, between two metallized zones 4, 5 of the flexible substrate 6.

This beam lead component, which is a diode in the example considered, is very small in size since it takes the form of a rectangular pad 350 $\mu$m long by 200 $\mu$m wide and about 40 $\mu$m thick. Its connection leads are constituted, as in any beam lead component, by minute straight tongues or beams positioned in the plane of its lower face. When it is soldered without special precautions, it is flat against the substrate 6, with its two connection leads 2, 3 fixed so as to extend between the two metallized zones 4, 5.

The slightest expansion of the flexible substrate 6 along the axis F tending to move the two metallized ranges 4, 5 away from each other generates a tensile force exerted between the connection leads 2, 3 of the component. Since this component is extended, all it can do is to support this tensile force. Indeed, given its brittleness due to its small dimensions and the nature of the materials constituting it (glass + silicon), it tends to break or to have its connection leads or their soldering broken.

In practice, the flexible substrate 6 may be subjected to expansion on many occasions, for example during the soldering of the second connection lead owing to a localized depression caused by the pressure of the tip of the soldering tool or, during manipulations, through a stress exerted on the flexible substrate 6 or again, during the working of equipment fitted out with such components, as a result of thermal variations. The result thereof is that there are very many instances of breakage of beam lead components implanted on a flexible substrate.

According to the invention, the tensile forces to which a "beam lead" mounted on a flexible substrate may be subjected are neutralized by a arching of its connection leads through a special mounting method, the main steps of which are illustrated in FIGS. 2a to 2e.

In these figures, the beam lead component 1 is supposed to be already in position on the flexible substrate 6 with a first connection lead 2 soldered to a metallized zone 4 in a standard way, for example by means of a soldering by thermocompression, the connection leads 2, 3 and the metallized zones being made of gold.

Figure 2A:
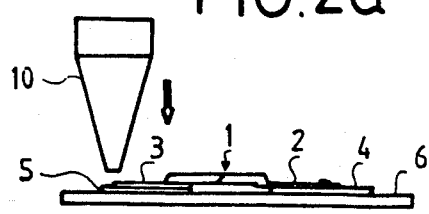
FIGS. 2a, b, c, d and e illustrate the different steps of the mounting method according to the invention.

FIG. 2a illustrates an initial phase of positioning of the heating tip 10 of the soldering thermocompression tool above the end of the second connection lead 3 of the beam lead component 1 which is placed on the metallized zone 5 to which it should be soldered.

Figure 2B:
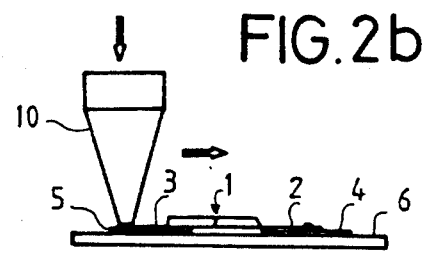

FIG. 2b illustrates the start of a stage for shifting a connection lead, where the heating tip 10 of the soldering tool is applied to the end of the second connection lead 3 with a pressure that is not sufficient for the soldering but is sufficient to grip this end, and then shift it towards the body of the beam lead component 1.

Figure 2C:
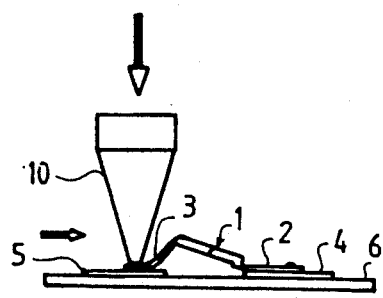

FIG. 2c illustrates the end of the shifting phase, the second connection lead 3 having been arched by the motion in which the heating tip 10 of the soldering tool approaches the body of the beam lead component 1.

Figure 2D:
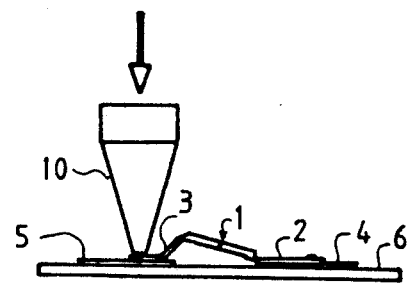

FIG. 2d illustrates the soldering phase proper of the second connection lead 3 of the beam lead component 1. This phase consists in triggering the heating of the tip of the tool while at the same time reinforcing the pressure exerted by the heating tip 10 of the soldering tool, after it has been fixed in its position, to prompt the soldering operation.

Figure 2E:
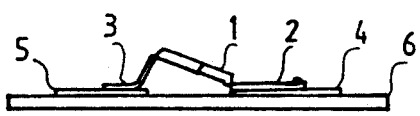

FIG. 2e illustrates the final position of the beam lead component 1 on the flexible substrate 6 as resulting from the implementation of the above mounting method. It is seen that the beam lead component 1 is no longer flat against the flexible substrate 6 but arched on its connection lead 3.

The arching is not done systematically on the second lead. It can also be done on the first lead of the beam lead component or again on both leads together.

Figure 3:
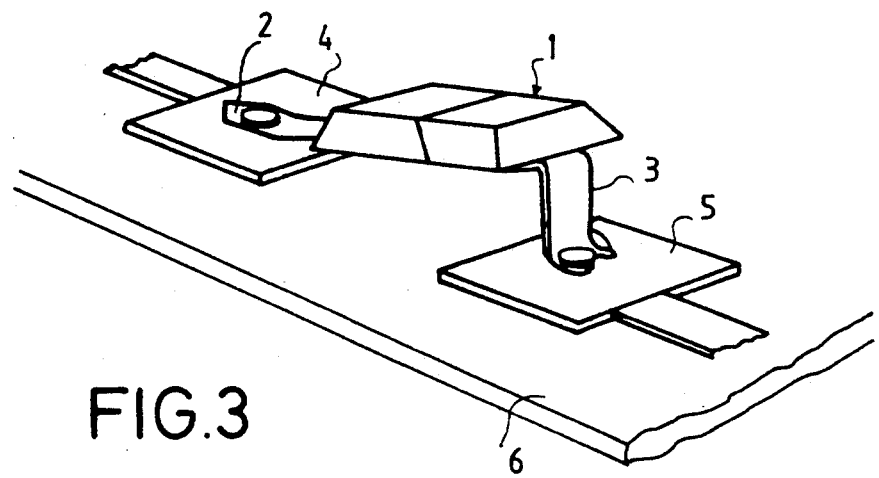
FIG. 3 shows a view, in perspective, of an electronic beam lead component mounted on a substrate by the implementation of the mounting method according to the invention.
Figure 4A:
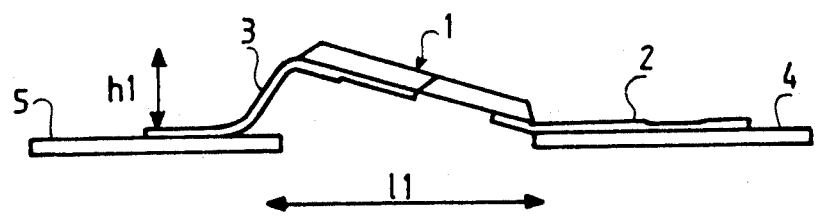
FIGS. 4a and 4b show a view, in profile, of an electronic beam lead component mounted on a flexible substrate by the method according to the invention, and illustrating the free play of this component with respect to the deformations of the substrate.
Figure 4B:
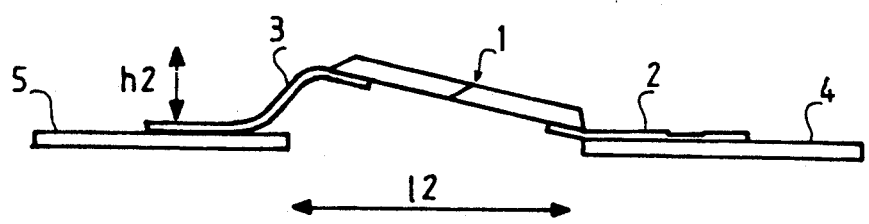

FIG. 3 clearly illustrates the raised position taken by the beam lead component 1 following the use of the mounting method that has just been described. This raised position enables the beam lead component 1, as shown in FIGS. 4a and 4b, to absorb the mechanical stresses that may be applied by the flexible substrate 6 between its connection leads 2, 3, by adopting variably flat positions, which it could not do when it was mounted flat with its connection leads 2, 3 in an extended position. Thus, for a span I2 between the metallized zones 4, 5 greater than a span I1, the beam lead component 1 will rise by a height h2 smaller than the height h1 taken for the span I1 while, at the same time, undergoing only a negligible residual tensile force.

The method for the mounting of beam lead components on a flexible substrate that has just been described can also be applied to beam lead components having more than two connection leads. These components then have a first connection lead soldered in a standard way to ensure that they are held in position on the substrate, and they have their other connection leads arched before being soldered by means of a shifting of the tip of the soldering tool. It enables a major reduction in the rate of breakage of the beam lead components during the soldering on a flexible substrate, the easier attaching of these components to these substrates and a major increase in the operational reliability of this type of components soldered on these substrates. Furthermore, its implementation is almost cost-free since it is done during the soldering operation, in using a standard soldering tool.

What is claimed is:

1. A method for the mounting, on a flexible substrate, of miniature electronic components with beam leads to be soldered, wherein said method consists, after a first connection lead of a component has been soldered to a metallized zone of the substrate, in arching each of the other connection leads during their soldering by pressing the connection lead considered on a metallized zone of the substrate by means of a tip of a soldering tool while, at the same time, making an approaching movement towards the body of the component with this tip before carrying out the soldering operation itself.

2. A method according to claim 1, wherein said tip is the heating tip of a thermocompression soldering tool.

* * * * *